(12) United States Patent
Shi

(10) Patent No.: US 11,117,670 B2
(45) Date of Patent: *Sep. 14, 2021

(54) METHODS AND APPARATUS TO DETECT DEICING HEATER CONDITIONS

(71) Applicant: The Boeing Company, Chicago, IL (US)

(72) Inventor: Fong Shi, Seattle, WA (US)

(73) Assignee: The Boeing Company, Chicago, IL (US)

( * ) Notice: Subject to any disclaimer, the term of this patent is extended or adjusted under 35 U.S.C. 154(b) by 388 days.

This patent is subject to a terminal disclaimer.

(21) Appl. No.: 16/012,448

(22) Filed: Jun. 19, 2018

(65) Prior Publication Data

US 2019/0382139 A1 Dec. 19, 2019

(51) Int. Cl.
*B64F 5/60* (2017.01)
*B64D 45/00* (2006.01)
*G01R 31/50* (2020.01)
*B64D 15/12* (2006.01)

(52) U.S. Cl.
CPC ............ *B64D 15/12* (2013.01); *B64D 45/00* (2013.01); *B64F 5/60* (2017.01); *G01R 31/50* (2020.01)

(58) Field of Classification Search
CPC . B64F 5/60; B64F 1/362; G01R 31/50; G01R 31/52; G01R 27/04; G01R 31/54; G01R 27/02; G01R 15/142; G01R 19/2513; G01R 15/20; B64D 15/12; B64D 45/00; B64D 43/02; G01N 15/0211; G01N 2291/0289
USPC ........... 324/537, 500, 511, 750.01, 521, 552, 324/600, 519, 617, 622, 683, 709, 66, 324/750.17, 754.28, 548, 658, 661, 76.66
See application file for complete search history.

(56) References Cited

U.S. PATENT DOCUMENTS

| | | | |
|---|---|---|---|
| 5,662,757 A * | 9/1997 | Langenbrunner | F01D 11/12 156/94 |
| 9,919,812 B2 * | 3/2018 | Shi | G08B 21/185 |
| 2015/0346255 A1 * | 12/2015 | Wagner | H02H 3/305 702/58 |
| 2018/0180671 A1 * | 6/2018 | Kalgren | G01R 31/315 |
| 2019/0256125 A1 * | 8/2019 | Ostrowski | G05B 13/048 |

* cited by examiner

*Primary Examiner* — Melissa J Koval
*Assistant Examiner* — Trung Q Nguyen
(74) *Attorney, Agent, or Firm* — Hanley, Flight & Zimmerman, LLC

(57) ABSTRACT

An example apparatus includes an interface to be electrically coupled between a heating element and a power supply, where the heating element associated with an external surface of a vehicle, and where the power supply is to provide power to the heating element. The interface includes a balanced current sensor to measure a differential between a first current of an electrical power line of the heating element and a second current of an electrical return line of the heating element, and a processor to compare the differential to at least one threshold to determine a condition of the heating element.

20 Claims, 5 Drawing Sheets

METHODS AND APPARATUS TO DETECT DEICING HEATER CONDITIONS

FIELD OF THE DISCLOSURE

This disclosure relates generally to aircraft and, more particularly, to methods and apparatus to detect deicing heater conditions.

BACKGROUND

In recent years, electric heaters, including electric heating elements, have been employed to prevent the formation of ice on aircraft surfaces during flight. In particular, these electric heaters are employed to reduce accumulation of ice, snow and/or frost, all of which can alter aerodynamic shapes of external surfaces of the aircraft, thereby causing adverse aerodynamic effects. Further, ice formations can result in erroneous data from sensors associated with the external surfaces.

Some known heaters can be prone to failure based on the harsh environmental conditions associated with flight. In particular, corrosion of heating elements can cause unintended conductive paths with an associated impedance to develop, thereby resulting in leakage current that can cause insufficient heat and, thus ice formation. Current known warning systems to detect heater failure are based on a fail open mode when a measured current is below a threshold and a fail-short mode if a measured current reaches a maximum level.

BRIEF DESCRIPTION OF THE DRAWINGS

The figures are not to scale. Instead, the thickness of the layers or regions may be enlarged in the drawings. In general, the same reference numbers will be used throughout the drawing(s) and accompanying written description to refer to the same or like parts.

DETAILED DESCRIPTION

Figure 1:
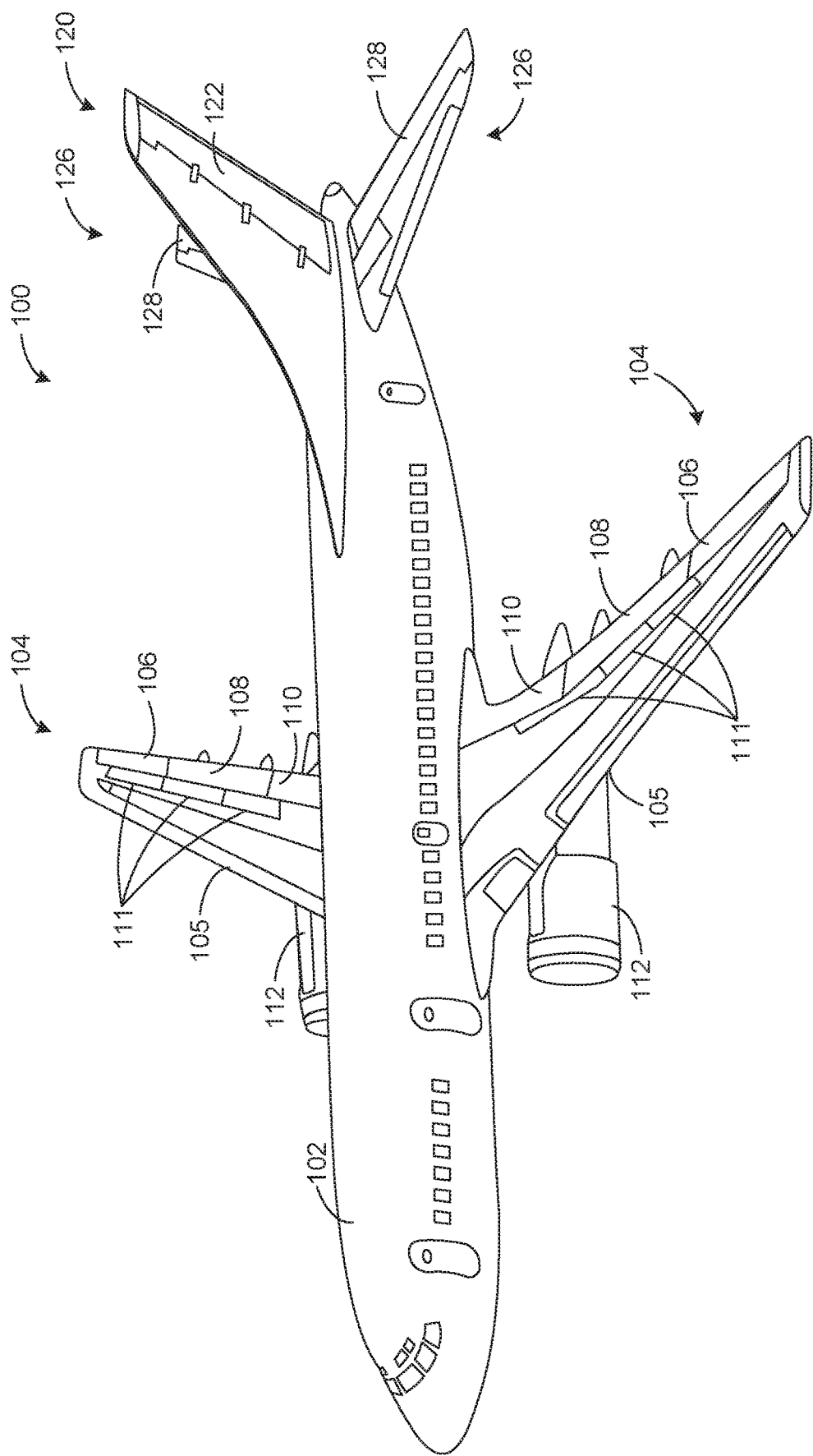
FIG. 1 illustrates an aircraft in which examples disclosed herein can be implemented.

Methods and apparatus to detect deicing heater conditions are disclosed. Some known aircraft employ heating elements to heat external surfaces and/or portions of the aircraft to remove ice or maintain a sensor (e.g., a flight operational sensor, a flight instrumentation sensor) at a desired temperature. However, the heating elements can be prone to corrosion and other effects because of relatively harsh environmental conditions associated with flight. The heating elements and/or their associated assemblies can be costly to replace.

Some known heater failure detection systems associated with heating elements have warning indications that indicate a fail open mode when measured current is below a threshold and a fail-short mode if measured current reaches a maximum level. However, these systems do not indicate degradation of the heating elements and, instead, indicate failure once the heating elements have very significant degradation or failure. Because failure of the heating elements can be unpredictable, often entire heating assemblies, which are costly, are prematurely replaced (e.g., replaced based on life predictions with a tolerance). Further, these heating elements can be operated with significant performance degradation (i.e., somewhat nonfunctional) before a problem is known.

Examples disclosed herein provide a cost-effective and accurate manner of evaluating an operating condition of a heating element. In particular, examples disclosed herein can be implemented without alteration of existing wiring configurations on an aircraft to provide warnings to a cockpit and/or maintenance crews regarding the operating condition of the heating element. As a result, unnecessary premature replacements can be reduced and/or eliminated, thereby greatly saving costs. Further, examples disclosed herein enable detection of degradation before failure, thereby enabling a timely replacement.

Examples disclosed herein provide accurate determinations of heating element operating conditions and provide appropriate warnings by utilizing an interface (e.g., a connector) electrically coupled or disposed between a power supply and a heating element that is associated with an external surface of a vehicle, such as an aircraft, for example. The interface includes a balanced current sensor to measure a differential between a first current of an electrical power line of the heating element and a second current of a return line of the heating element. Further, a processor is implemented to compare the differential to at least one threshold to determine a condition of the heating element.

In some examples, the balanced current sensor includes a toroidal ring. In some examples, the electrical power line and the return electrical line are wrapped around the toroidal ring with an equivalent number of turns in the same direction. In some examples, the interface includes a solid state relay switch that can be toggled to control power provided to the heating element. In some examples, a current sensor to detect an open circuit is electrically coupled between the interface and the power supply.

As used herein, the term "interface" refers to a connector, wiring, circuit boards, flexible circuit boards, a junction box and/or a circuit panel that may be electrically coupled to other electrical components or wiring. As used herein, the term "heating element" refers to any device, system and/or assembly used to generate and provide heat to a component and/or surface. Accordingly, the term "heating element" can refer to, but is not limited to, resistive coils or elements in a casing (e.g., a metal casing), metal parting strips, and carbon fiber strips, etc.

FIG. 1 illustrates an aircraft 100 in which examples disclosed herein can be implemented. The aircraft 100 includes a fuselage 102 and wings 104, which include ailerons 106, leading edge control surfaces (e.g., slats, flaps, etc.) 105, flaps 108, 110 and spoilers 111. The aircraft 100 also includes engines 112, a fin 120 with a rudder 122, and stabilizers 126 with elevators 128.

In operation, the aircraft 100 includes multiple external sensors associated with external surfaces of the aircraft 100. The sensors are heated during flight to maintain accuracy and/or an operating life thereof. These sensors are heated proximate external surfaces of the aircraft 100. As a result, the heaters and/or heating elements associated with the external surfaces can be subject to harsh conditions, such as relatively large temperature changes, during flight.

Examples disclosed herein enable accurate determination of operating conditions of the heaters associated with external surfaces of the aircraft 100. In particular, examples disclosed herein can be applied to heaters associated with any of the fuselage 102, the wings 104, the leading edge control surfaces 105, the engines 112, the fin 120, the stabilizers 126 or any other outer structures are subjected to the external conditions of flight (e.g., temperatures, pressures, wind flow, rain, ice, etc.).

Figure 2:
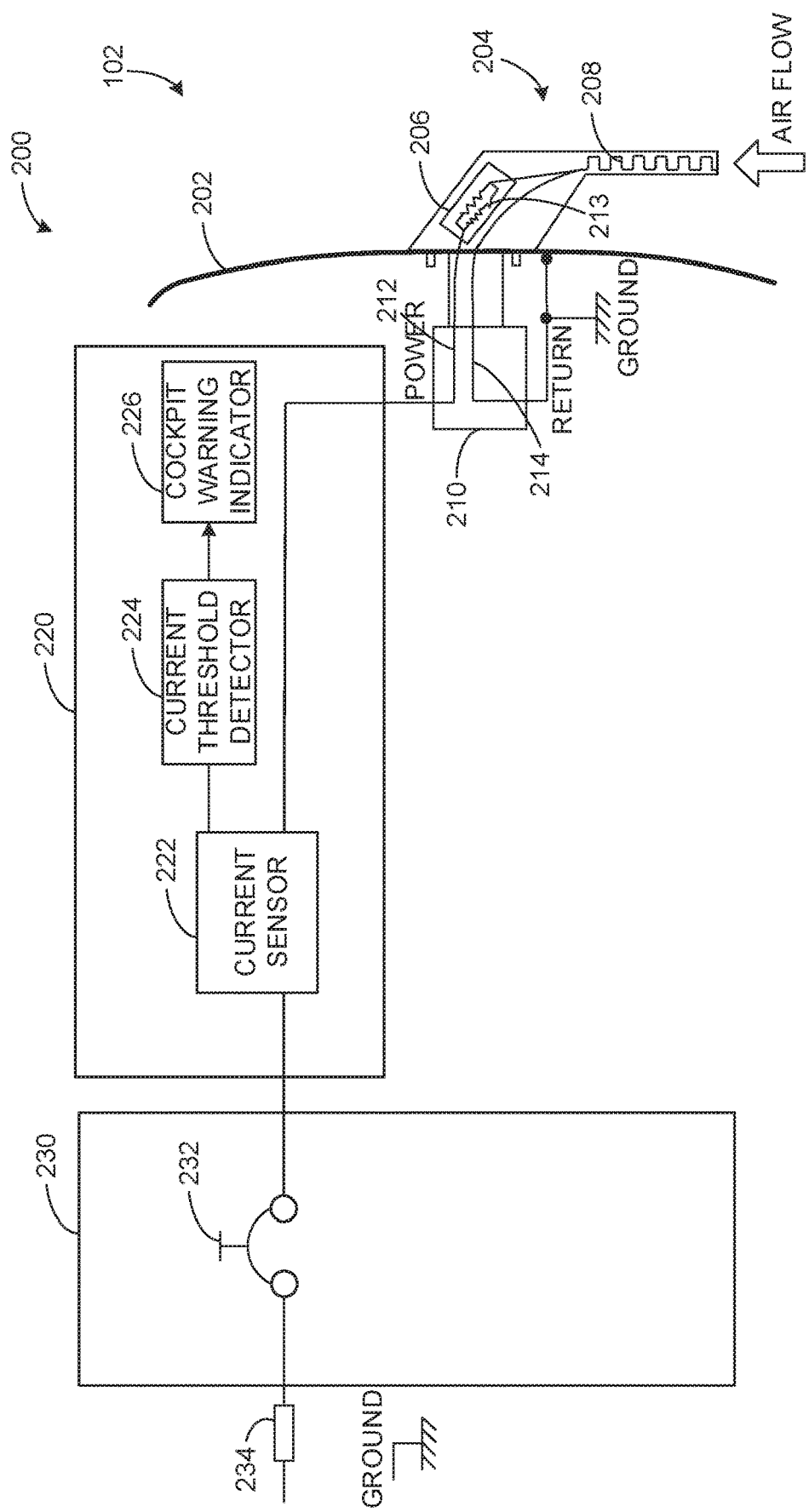
FIG. 2 is a schematic overview of a known deicing heater system.

FIG. 2 is a schematic overview of a known deicing heater system 200. The known deicing heater system 200 is associated with an airframe 202 of the fuselage 102 shown in FIG. 1 and includes a probe (e.g., a pitot probe, a speed probe, a heated probe, a sensor probe, a pressure probe, etc.) 204, which includes a thermal pack (e.g., a variable resistance thermal pack) 206 and a heating element 208. The deicing heater system 200 also includes a connector 210 that is electrically coupled to an electrical power supply line (e.g., an electrical power line) 212 which, in turn, is electrically coupled to an adjustable resistor 213 of the thermal pack 206. Further, the connector 210 is electrically coupled to an electrical return line 214 associated with the probe 204. The deicing heater system 200 also includes a panel 220, which includes a current sensor 222, a current threshold detector 224 and a cockpit warning indicator 226. As can be seen in FIG. 2, the deicing heater system 200 also includes a panel 230 with a circuit breaker 232 and a power supply 234, which is implemented as a 115 V 400 Hz AC power supply in this example. In this example, the electrical return line 214 is not routed to the panels 220, 230, as is done on some relatively larger airplanes (e.g., wide-body aircraft). Instead, the electrical return line 214 is locally tied or coupled to the airframe 202 (e.g., for narrow-body aircraft).

To power the heating element 208, the power supply 234 provides power to the heating element 208 via the panel 220 and the connector 210. Further, the thermal pack 206 is used to vary an amount of current provided to the heating element 208 to prolong a life of the probe 204. In particular, the thermal pack 206 varies current provided to the heating element 208 to maintain the probe 204 at a target temperature and/or within a temperature range.

The circuit breaker 232 functions as a slow blow circuit breaker that provides current to the current sensor 222, which is electrically coupled to the current threshold detector 224 which, in turn, is electrically coupled to the cockpit warning indicator 226. The circuit breaker 232 does not react to in-rush or transient conditions, but will instead cut off power to the probe 204 if a current draw of the heating element 208 exceeds a current threshold (e.g., 2.5 amps (A)).

To provide indication of potential failure of the probe 204 or the heating element 208, an open circuit warning by the cockpit warning indicator 226 is triggered when current measured at the current sensor 222 falls below a certain threshold. Because of the large variations of power (i.e., AC power) and current to the heating element 208, the aforementioned threshold can have a very high error percentage (e.g., +/−50%, 60 mA+/−30 mA). In contrast to examples disclosed herein, the known deicing heater system 200 can only detect open-circuit failures associated with the heating element 208 with limited accuracy. Further, the circuit breaker 232 can be slow to react to over-current conditions. In other words, the known deicing heater system 200 does not characterize or detect degradation of the probe 204 and/or the heating element 208 until a significant failure and/or degradation has occurred. In particular, developed current leakage paths from the heating element 208 (e.g., due to corrosion) can lead to current values that are higher than the threshold associated with the open-circuit detection of the sensor 222 but lower than the threshold associated with the circuit breaker 232, thereby escaping detection. As a result, a degradation condition of the heating element 208 is only known when the current drawn by the probe 204 is high enough to trip the circuit breaker 232 or when the heating element 208 burns, thereby causing an open circuit. Accordingly, the degraded heating element 208 in this known example can cause ice to form at an opening of the probe 204, in which air flows, thereby causing erroneous measurements to be provided to cockpit instrumentation.

In some other known examples, a polarity of the wires to the heating element 208 is reversed from that shown in FIG. 2. In such scenarios, if current provided to a partially shorted heating element 208 does not trip the circuit breaker 232, the probe 204 can still be heated until the heating element 208 is burnt open to cause an open-circuit fault at the current sensor 222. A partially chassis-shorted heating element 208 can bypass the current limiting protection of the thermal pack 206 in such scenarios. Without functionality of the thermal pack 206, the partially failed probe 204 and/or the heating element 208 can quickly bring about failure in a relatively short amount of time.

Figure 3:
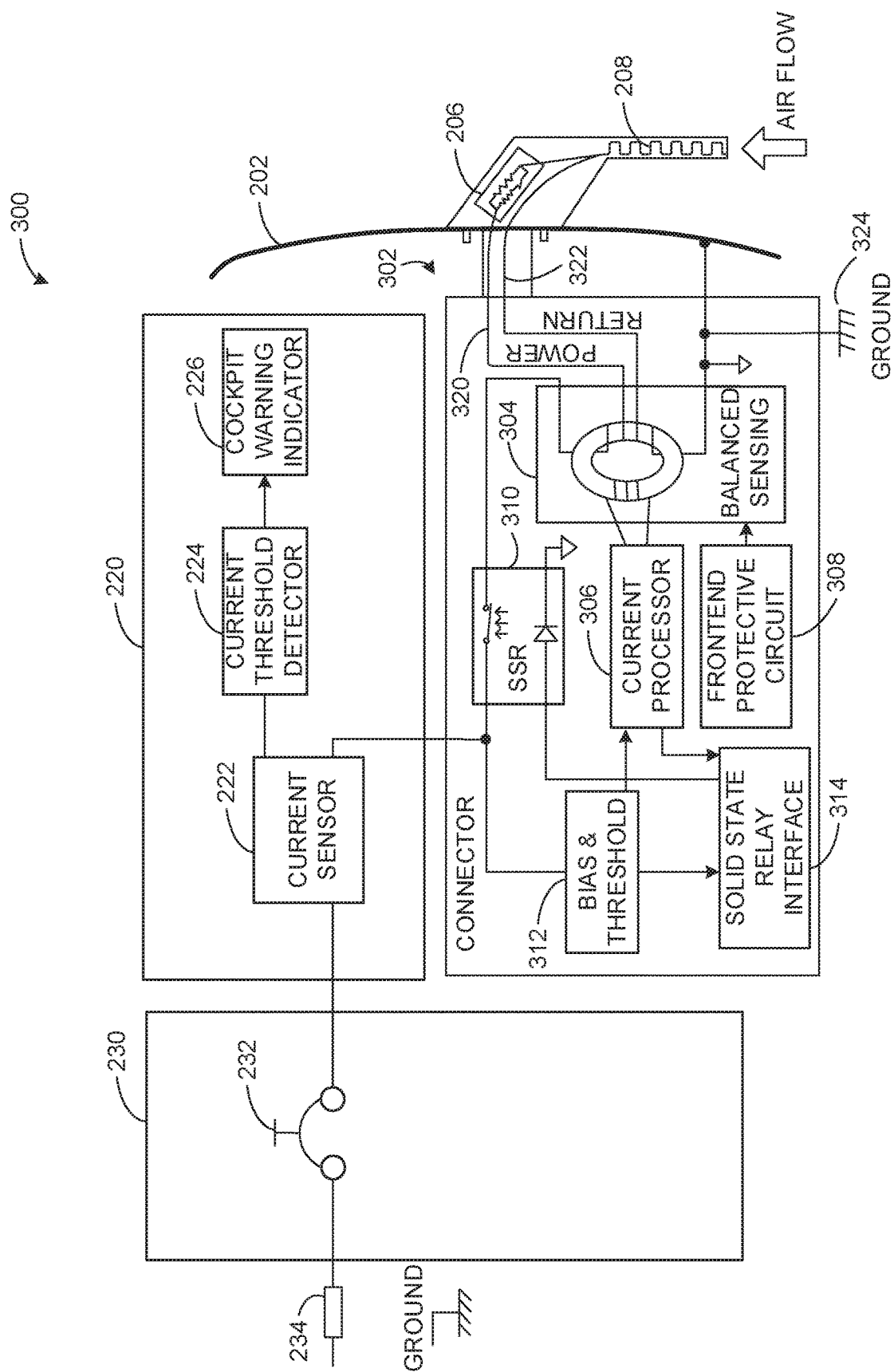
FIG. 3 is a schematic overview of an example deicing heater system in accordance with the teachings of this disclosure.

FIG. 3 is a schematic overview of an example deicing heater system 300 in accordance with the teachings of this disclosure. The deicing heater system 300 of the illustrated example includes the panels 220 and 230 shown in the known example of FIG. 2, and additionally includes an example interface (e.g., a connector, an inline circuit, a wire circuit, etc.) 302 instead of the connector 210. The interface 302 of the illustrated example includes a balanced sensor (e.g., a balanced current sensor, etc.) 304, a current processor 306, front end protective circuits 308, a solid state relay (SSR) switch 310, a bias and threshold component 312, and a solid state relay interface 314.

According to the illustrated example, an electrical power line (e.g., a hot electrical line) 320 is electrically coupled between the thermal pack 206 and the balanced sensor 304. Further, a return electrical line 322 is coupled between the heating element 208 and the balanced sensor 304. Further, a ground 324 is electrically coupled to the airframe 202 and the balanced sensor 304.

The example bias and threshold component 312 provides power conversion through rectifying, stepping down and/or converting AC to DC operating voltages. In this example, the bias and threshold component 312 also generates detection thresholds to indicate a warning and a failure, respectively. In this example, a minimum level of imbalanced AC differential current is predetermined (e.g., 12 milliamps (mA) RMS) as a warning threshold. This threshold is adjustable according to system requirements and/or current flight conditions (e.g., an operating condition of an external sensor, a flight mode, etc.). In this example, the failure threshold due to imbalanced AC differential current is also defined (e.g., at 25 mA). While the example threshold values are described above, the aforementioned threshold values can vary across aircraft models, flight parameters, aircraft usage, etc. The bias and threshold component 312 can also function as a built-in-tester to verify that the circuitry of the deicing heater system 300 is functioning properly.

The balanced sensor 304 of the illustrated example measures differential or imbalanced current from the electrical power line 320 and the return electrical line 322. In this example, reversing wiring polarity of the electrical power line 320 and the return electrical line 322 does not affect differential sensing performed by the balanced sensor 304. Accordingly, when the heating element 208 develops a partial short to the airframe 202, an imbalance in current between the electrical power line 320 and the return electrical line 322 produces a differential signal, which is amplified and electrically isolated by the balanced sensor 304. In particular, steady state differential imbalanced current between the electrical power line 320 and the return electrical line 322 is measured by a current transformer defined by the balanced sensor 304. In particular, first and second coils of both the electrical power line 320 and the return electrical line 322, respectively, define the current transformer. In some examples, a turns ratio of the current transformer is set so that a relatively low amount of current imbalance produces sufficient signal levels across a transformer secondary. In some examples, the output of the balanced sensor 304 includes an instrumentation amplifier with a predetermined gain setting. Accordingly, when a deicing heater electrically coupled thereto has no chassis leakage due to casing isolation, the balanced sensor 304 will, thus, not generate a significant unbalanced current signal (e.g., a near-zero level unbalanced current signal).

The balanced sensor 304 of the illustrated example exhibits a generally toroidal ring shape, or any other appropriate shape having encircled magnetic flux paths. In particular, the electrical power line 320 and the return electrical line 322 are wound in the same manner around the example toroidal ring (e.g., at opposite sides of a line of symmetry defined by a center axis) of the balanced sensor 304. Furthermore, in this example, both the electrical power line 320 and the return electrical line 322 are wrapped around the balanced sensor 304 with an identical or equivalent number of turns with respect to their coils.

The example current processor 306 filters, amplifies, scales, conditions and/or delays a signal provided by the balanced sensor 304. In this example, the aforementioned signal is also compared to two thresholds including a warning threshold and a failure threshold provided by the bias and threshold component 312. If a level of the signal exceeds the warning threshold, the current processor 306 causes the cockpit warning indicator 226 to indicate a warning (e.g., a blinking warning light). If the signal level exceeds the failure threshold, the current processor 306 causes the cockpit warning indicator 226 to display a failure indication (e.g., a solid warning light). For example, if the electrical power line 320 has a measurable current of 500 mA while the return electrical line 322 has a current of 485 mA, the corresponding difference of 15 mA (e.g., the 15 mA difference is the leakage to the airframe 202 due to a partially shorted heating element 208), which is greater than a 12 mA warning threshold, will cause the cockpit warning light of indicator 226 to blink.

In another example, if the return electrical line 322 has a current of 450 mA (instead of 485 mA), which corresponds to a differential greater than a 25 mA failure threshold, and the heating element 208 further degrades over time, the cockpit warning indicator 226 will indicate a failure by having a warning light stay on, for example. While events such as lightning strikes and radio frequency transmitters may induce current spikes on the electrical lines 320, 322, noise filters can be implemented to delay relay trigger and, thus, reduce or eliminate potential false triggers caused by such transients. Additionally or alternatively, inrush current (e.g., when power is initially applied to the heating element 208) can be accounted for.

According to the illustrated example, the solid state relay interface 314 directs the solid state relay switch 310 to close internal contacts to provide power to the heating element 208. In this example, when the current processor 306 determines that a differential current exceeds the warning threshold, the cockpit warning indicator 226 indicates a warning. In contrast, when the failure threshold is exceeded, the solid state relay interface 314 switches off the example solid state relay switch 310, thereby not providing the power to the heating element 208 and the cockpit warning indicator 226 indicates a warning. In other words, the solid state relay interface 314 ensures that power provided to the heating element 208 is turned off during a failure event. In some examples, power cycling is performed to return power to the heating element 208 after a detected failure (e.g., by resetting the circuit breaker 232).

The example solid state relay switch 310 includes a photodiode and a power semiconductor switch. In this example, the switch is controlled by coupling photons emitted by the photodiode. In this example, power applied to the solid state relay interface 314 causes the solid state relay switch 310 to be in an ON state (e.g., the solid state relay switch 310 is closed) to power the heating element 208.

The frontend protective circuits 308 of the illustrated example protect against lightning and EMI transients, which can cause current to flow through the aircraft 100, thereby inducing current in wires or circuits beneath the fuselage 102. In some examples, metal enclosures and/or wire conduits within the fuselage 102 are implemented to shield circuits from induced current that might occur proximate an external surface of the fuselage 102. In some examples, transient suppression Metal Oxide Varistors (MOV) or Transient Voltage Suppressors (TVS) or any other appropriate equivalents are implemented to protect the interface 302 and other electrical components from lightning strikes and EMI transients, for example.

In some examples, the interface 302 is implemented as a connector. Additionally or alternatively, the interface 302 is implemented as a circuit board (e.g., a rigid circuit board, a flexible circuit board, etc.). In some examples, the interface 302 is retrofit, assembled and/or coupled to a vehicle (e.g., a vehicle being manufactured, a vehicle already in-service). In particular, the interface 302 can be electrically coupled to a heating element of a pitot tube, or any another appropriate structure mounted proximate an external surface of the aircraft 100. In such examples, the interface 302 is communicatively coupled to a cockpit interface.

While example threshold values, current values, voltage values, etc. are described above, any appropriate values can be implemented based on design parameters and/or operating conditions associated with the aircraft 100.

While an example manner of implementing the deicing heater system 300 of FIG. 3 is illustrated in FIG. 3, one or more of the elements, processes and/or devices illustrated in FIG. 3 may be combined, divided, re-arranged, omitted, eliminated and/or implemented in any other way. Further, the example current processor 306, the example solid state relay interface 314, the example bias and threshold component 312 and/or, more generally, the example deicing heater system 300 of FIG. 3 may be implemented by hardware, software, firmware and/or any combination of hardware, software and/or firmware. Thus, for example, any of the example current processor 306, the example solid state relay interface 314, the example bias and threshold component 312 and/or, more generally, the example deicing heater system 300 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example current processor 306, the example solid state relay interface 314, and/or the example bias and threshold component 312 is/are hereby expressly defined to include a non-transitory computer readable storage device or storage disk such as a memory, a digital versatile disk (DVD), a compact disk (CD), a Blu-ray disk, etc. including the software and/or firmware. Further still, the example deicing heater system 300 of FIG. 3 may include one or more elements, processes and/or devices in addition to, or instead of, those illustrated in FIG. 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4:
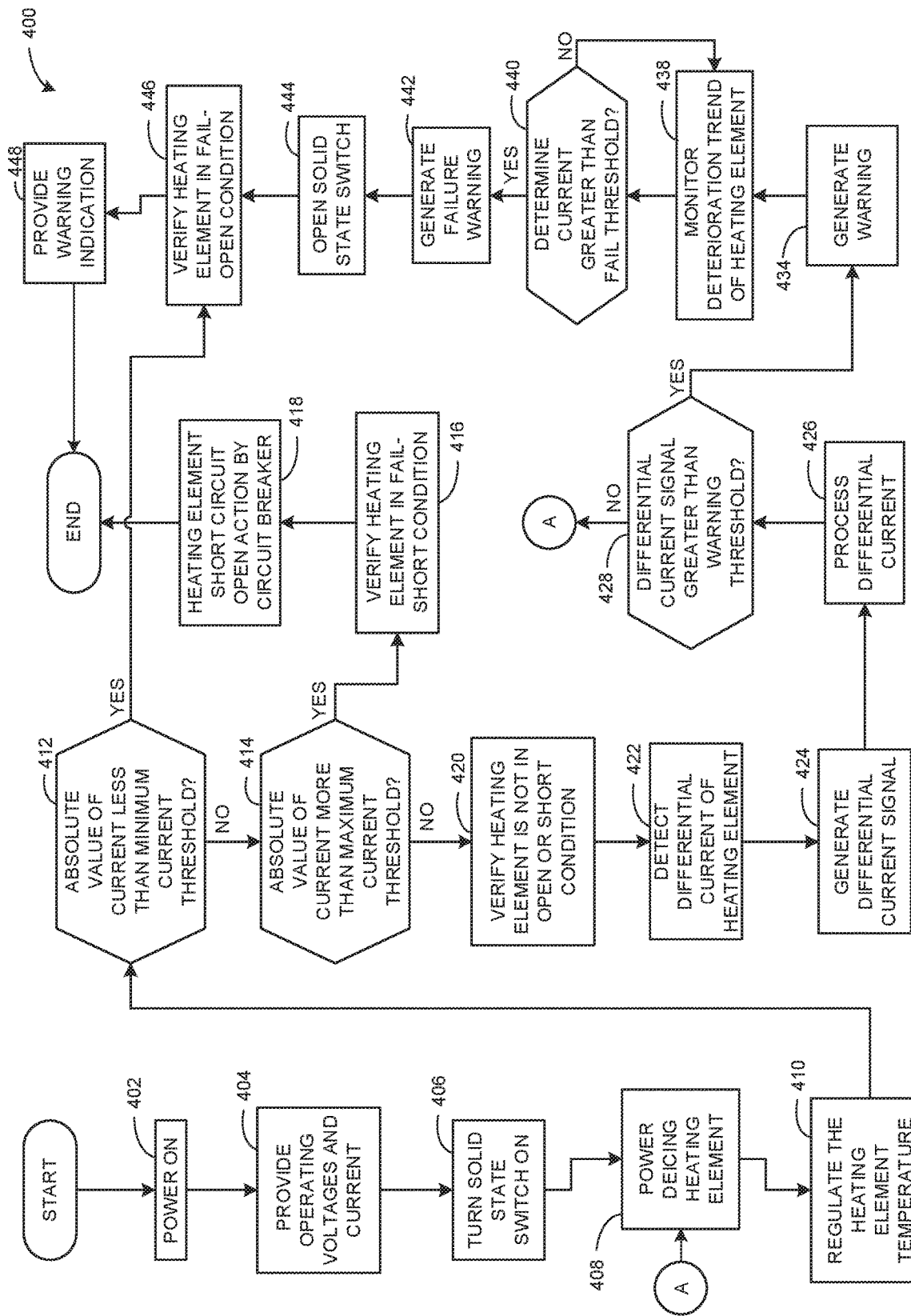
FIG. 4 is a flowchart representative of machine readable instructions that may be executed to implement examples disclosed herein.

A flowchart representative of example hardware logic, machine readable instructions, hardware implemented state machines, and/or any combination thereof for implementing the deicing heater system 300 of FIG. 3 is shown in FIG. 4. The machine readable instructions may be an executable program or portion of an executable program for execution by a computer processor such as the processor 512 shown in the example processor platform 500 discussed below in connection with FIG. 5. The program may be embodied in software stored on a non-transitory computer readable storage medium such as a CD-ROM, a floppy disk, a hard drive, a DVD, a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowchart illustrated in FIG. 4, many other methods of implementing the example deicing heater system 300 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 4 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

The example method 400 of FIG. 4 begins as the circuit breaker 232 is caused to provide power to the panel 220 and the interface 302, thereby also powering the probe 204 (block 402).

According to the illustrated example, the bias and threshold component 312 provides and/or defines operating voltages and/or currents of the interface 302 (block 404). Further, the bias and threshold component 312 defines both warning and failure current thresholds associated with differential measurements made by the balanced sensor 304. In some examples, these thresholds are adjusted based on flight conditions and/or operating modes.

In this example, the solid state relay switch 310 is closed and, thus, turned on by the solid state relay interface 314 and/or the bias and threshold component 312 (block 406).

Based on the closing of the solid state relay switch 310, power is provided to a deicing heater, which is the heating element 208 in this example, by the interface 302 (block 408).

In this example, the thermal pack 206 regulates power provided to the heating element 208 (block 410). In particular, the variable resistor 213 varies current provided to the heating element 208 based on a temperature of the heating element 208.

It is determined whether an absolute value of a current measured by the current sensor 222 is less than a minimum open-circuit threshold (block 412). If the current is less than the threshold (block 412), control of the process proceeds to block 446. Otherwise, the control of the process proceeds to block 414.

At block 414, it is also determined whether an absolute value of a current measured by the current sensor 222 is greater than a maximum short circuit threshold (block 414). If the current is greater than the threshold (block 414), control of the process proceeds to block 416. Otherwise, the control of the process proceeds to block 420.

At block 416, in some examples, the heating element 208 is verified to be in a fail-short condition (block 416).

At block 418, the circuit breaker 232 performs an opening action based on the determination that the heating element is in the fail-short condition (block 418) and the process ends.

At block 420, in some examples, the heating element 208 is verified to not be in an open or short-circuit condition (block 420).

Next, the balanced current senor 304 of the illustrated example detects a current differential between the electrical power line 320 and the return electrical line 322 (block 422).

In some examples, a signal associated with the current differential is generated by the current processor 306 (block 424).

In some examples, the balanced sensor 304 and/or the current processor 306 process the signal associated with the current differential (block 426). The signal may be amplified, rectified, scaled, converted and/or offset in time.

The solid state relay interface 314 and/or the current processor 306 then determine if the differential current signal and/or the differential current is greater than a warning threshold provided by the bias and threshold component 312 (block 428). If greater than the warning threshold (block 428), control of the process proceeds to block 434. Otherwise, control of the process proceeds to block 408 based on the heating element 208 operating normally. In other words, a differential current below the warning threshold indicates normal operation of the heater element 208 in this example.

At block 434, a warning and/or warning signals is generated by the cockpit warning indicator 226 based on the differential current being greater than the warning threshold (block 434). In this example, the cockpit warning indicator 226 causes a light to blink. Additionally or alternatively, a recommendation for early inspection of the probe 204 and/or the heating element 208 is forwarded to a cockpit interface.

In some examples, the current processor 306, the balanced sensor 304 and/or the bias and threshold component 312 are used to monitor deterioration of the heating element 208 (block 438). This monitoring can be automatically triggered by the differential current being measured above the warning threshold until power is shut off by the circuit breaker 232. In some examples, a remaining life of the probe 204 and/or the heating element 208 is estimated based on trends and/or shifts in the differential current.

Next, it is determined if the differential current exceeds the failure threshold (block 440). If the differential current does not exceed the failure threshold (block 440), control of the process returns to block 438. Otherwise, control of the process proceeds to block 442.

A failure warning is generated by the cockpit warning indicator 226 (block 442). In this example, the light in the cockpit is caused to stay on instead of simply blinking (during the warning phase).

At block 444, the solid state relay switch 310 is opened (block 444). In particular, an internal contact of the solid state relay switch 310 is opened, thereby preventing the interface 302 from powering the probe 204.

In some examples, whether the heater element 208 is in a fail-open condition is verified (block 446).

In this example, the cockpit warning indicator 226 causes a failure warning indication to be provided to the cockpit based on an open-circuit of the (block 448) and the process ends.

Figure 5:
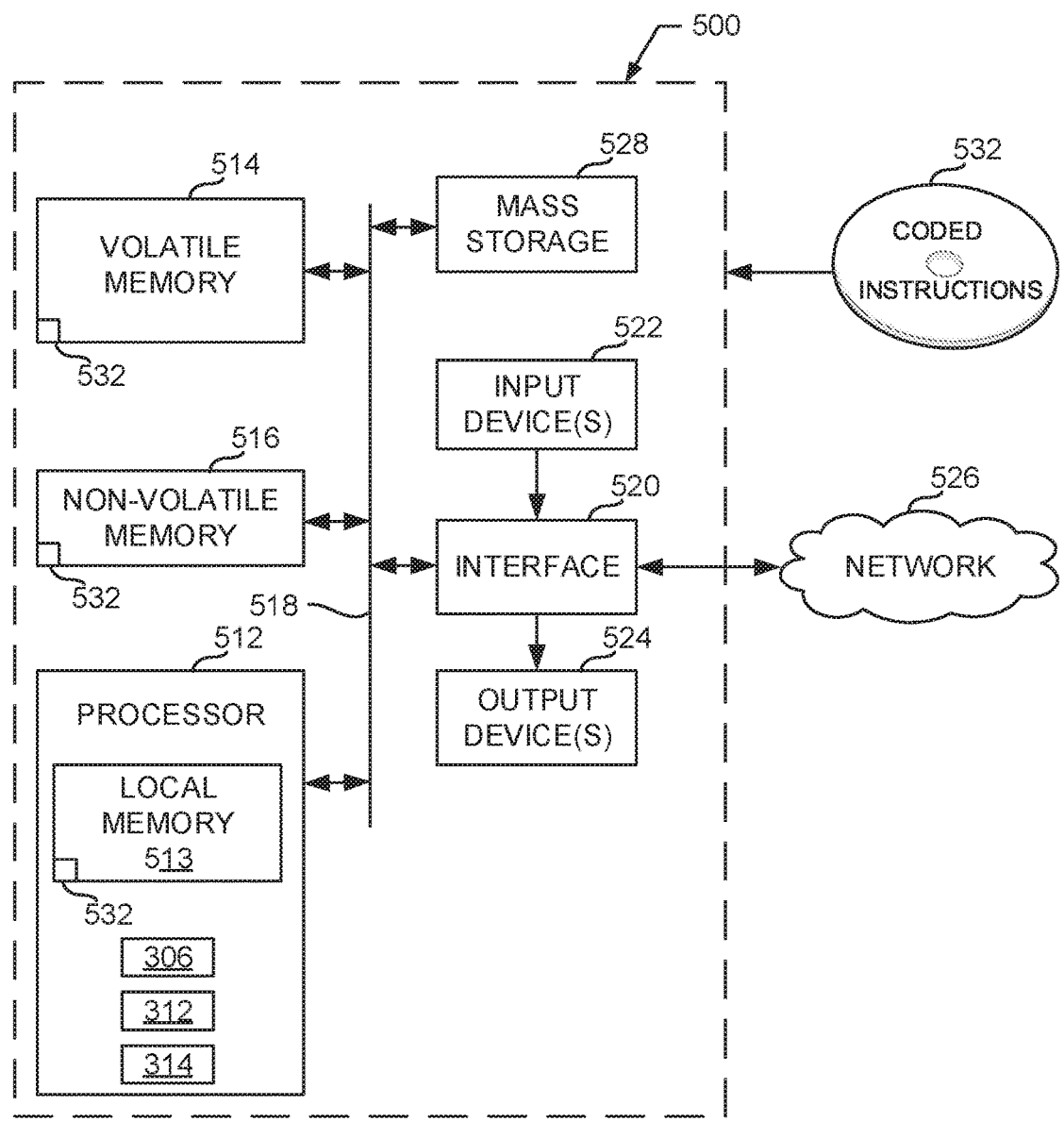
FIG. 5 is a block diagram of an example processing platform structured to execute the instructions of FIG. 4 to implement the example deicing heater system of FIG. 3.

FIG. 5 is a block diagram of an example processor platform 500 structured to execute the instructions of FIG. 4 to implement the deicing heater system 300 of FIG. 3. The processor platform 500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 500 of the illustrated example includes a processor 512. The processor 512 of the illustrated example is hardware. For example, the processor 512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example current processor 306, the example solid state relay switch 310, and the example bias and threshold component 312.

The processor 512 of the illustrated example includes a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 516 may be implemented by flash memory and/or any other desired type of memory device. Access to the main memory 514, 516 is controlled by a memory controller.

The processor platform 500 of the illustrated example also includes an interface circuit 520. The interface circuit 520 may be implemented by any type of interface standard, such as an Ethernet interface, a universal serial bus (USB), a Bluetooth® interface, a near field communication (NFC) interface, and/or a PCI express interface.

In the illustrated example, one or more input devices 522 are connected to the interface circuit 520. The input device(s) 522 permit(s) a user to enter data and/or commands into the processor 512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 524 are also connected to the interface circuit 520 of the illustrated example. The output devices 524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 520 of the illustrated example, thus, typically includes a graphics driver card, a graphics driver chip and/or a graphics driver processor.

The interface circuit 520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 500 of the illustrated example also includes one or more mass storage devices 528 for storing software and/or data. Examples of such mass storage devices 528 include floppy disk drives, hard drive disks, compact disk drives, Blu-ray disk drives, redundant array of independent disks (RAID) systems, and digital versatile disk (DVD) drives.

The machine executable instructions 532 of FIG. 4 may be stored in the mass storage device 528, in the volatile memory 514, in the non-volatile memory 516, and/or on a removable non-transitory computer readable storage medium such as a CD or DVD.

Example 1 includes an apparatus having an interface to be electrically coupled between a heating element and a power supply, where the heating element is associated with an external surface of a vehicle, and where the power supply is to provide power to the heating element. The interface includes a balanced current sensor to measure a differential between a first current of an electrical power line of the heating element and a second current of an electrical return line of the heating element, and a processor to compare the differential to at least one threshold to determine a condition of the heating element.

Example 2 includes the apparatus of Example 1, where the interface further includes a solid state relay communicatively coupled to the processor, and where the solid state relay is to vary current provided to the heating element.

Example 3 includes the apparatus of Example 1, where the balanced current sensor includes a toroidal ring, and where the electrical power line and the return electrical line are coiled around the toroidal ring.

Example 4 includes the apparatus of Example 3, where the electrical power line and the return electrical line are coiled around the toroidal ring with an equivalent number of turns.

Example 5 includes the apparatus of Example 1, and further includes a current sensor electrically coupled between the interface and the power supply, the current sensor to detect an open circuit.

Example 6 includes the apparatus of Example 1, where the interface is disposed in a connector that electrically couples the power supply to the heating element.

Example 7 includes the apparatus of Example 1, and further includes a variable resistance thermal pack electrically coupled to the heating element.

Example 8 includes the apparatus of Example 1, where the interface further includes a protective circuit that is electrically coupled to the balanced current sensor.

Example 9 includes a method, which includes applying a current from a power supply to a heating element associated with an external surface of a vehicle, measuring, at an interface electrically coupled between the power supply and the heating element, a differential between a first current of an electrical power line of the heating element and a second current of an electrical return line of the heating element, and comparing, via instructions executed by a processor, the differential to at least one threshold to determine a condition of the heating element.

Example 10 includes the method of Example 9, where comparing the differential to at least one threshold includes comparing the differential to a warning threshold and a failure threshold.

Example 11 includes the method of Example 9, and further includes determining a degradation condition of the heating element based on the differential.

Example 12 includes the method of Example 9, and further includes providing a warning based on the differential.

Example 13 includes the method of Example 9, and further includes estimating a remaining life of the heating element based on the differential.

Example 14 includes the method of Example 9, and further includes toggling a switch of the interface based on the differential.

Example 15 includes the method of Example 14, where the switch is a solid state relay switch.

Example 16 includes a method, which includes electrically coupling an interface between a power supply and a heating element associated with an external surface of a vehicle. The interface includes a balanced current sensor to measure a differential between a first current of an electrical power line of the heating element and a second current of an electrical return line of the heating element, and a processor to compare the differential to at least one threshold to determine a condition of the heating element.

Example 17 includes the method of Example 16, where the interface is electrically coupled between the power supply and the heating element as a connector.

Example 18 includes the method of Example 16, and further includes installing the heating element to a pitot tube.

Example 19 includes the method of Example 16, where the vehicle is an aircraft.

Example 20 includes the method of Example 19, and further includes communicatively coupling the interface to a cockpit interface of the aircraft.

From the foregoing, it will be appreciated that example methods, apparatus and articles of manufacture have been disclosed that enable accurate and effective determination of a deteriorated heating element, thereby avoiding costly early replacement. Examples disclosed herein also enable highly accurate determination of premature failure of heating elements, thereby reducing potential use of failed or significantly degraded components. Further, examples disclosed herein are not significantly affected by fluctuations of supply voltages and current amplitudes that can be caused by transients, tolerances and variability of current provided.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
    an interface to be electrically coupled between a heating element and a power supply, the heating element associated with an external surface of an aircraft, the power supply to provide power to the heating element, the interface including:
        a balanced current sensor to measure a differential between a first current of an electrical power line of the heating element and a second current of an electrical return line of the heating element, the balanced current sensor including a toroidal ring, wherein the electrical power line and the electrical return line are coiled around the toroidal ring with an equivalent number of turns, and
        a processor to compare the differential to at least one threshold to calculate a degree of degradation of the heating element to determine a replacement schedule of the heating element.

2. The apparatus as defined in claim 1, wherein the interface further includes a solid state relay communicatively coupled to the processor, and wherein the solid state relay is to vary current provided to the heating element.

3. The apparatus as defined in claim 1, further including a current sensor electrically coupled between the interface and the power supply, the current sensor to detect an open circuit.

4. The apparatus as defined in claim 1, wherein the interface is disposed in a connector that electrically couples the power supply to the heating element.

5. The apparatus as defined in claim 1, further including a variable resistance thermal pack electrically coupled to the heating element.

6. The apparatus as defined in claim 1, wherein the interface further includes a protective circuit that is electrically coupled to the balanced current sensor.

7. The apparatus as defined in claim 1, wherein the processor is to determine whether the heating element is in a fail-open condition.

8. The apparatus as defined in claim 1, wherein an output of the balanced current sensor is to include an instrumentation amplifier.

9. The apparatus as defined in claim 2, wherein the solid state relay is to further power cycle the heating element based on a detected failure.

10. A method comprising:
electrically coupling an interface between a power supply and a heating element associated with an external surface of an aircraft, wherein the interface includes:
   a balanced current sensor to measure a differential between a first current of an electrical power line of the heating element and a second current of an electrical return line of the heating element, the balanced current sensor including a toroidal ring, wherein the electrical power line and the electrical return line are coiled around the toroidal ring with an equivalent number of turns, and
   a processor to:
      compare the differential to at least one threshold to calculate a degree of degradation of the heating element, and
      determine a replacement schedule of the heating element based on the calculated degree of degradation.

11. The method as defined in claim 10, further including power cycling the heating element based on a detected failure.

12. A method comprising:
applying a current from a power supply to a heating element associated with an external surface of an aircraft;
measuring, at a balanced current sensor of an interface electrically coupled between the power supply and the heating element, a differential between a first current of an electrical power line of the heating element and a second current of an electrical return line of the heating element, the balanced current sensor including a toroidal ring, wherein the electrical power line and the electrical return line are coiled around the toroidal ring with an equivalent number of turns;
comparing, via instructions executed by at least one processor, the differential to at least one threshold to calculate a degree of degradation of the heating element; and
determining, via instructions executed by the at least one processor, a replacement schedule of the heating element based on the calculated degree of degradation.

13. The method as defined in claim 12, wherein comparing the differential to at least one threshold includes comparing the differential to a warning threshold and a failure threshold.

14. The method as defined in claim 12, further including providing, via instructions executed by the at least one processor, a warning based on the differential.

15. The method as defined in claim 12, further including toggling a switch of the interface based on the differential.

16. The method as defined in claim 15, wherein the switch is a solid state relay switch.

17. The method as defined in claim 12, further including power cycling the heating element based on a detected failure.

18. The method as defined in claim 10, wherein the interface is electrically coupled between the power supply and the heating element as a connector.

19. The method as defined in claim 10, further including installing the heating element to a pitot tube.

20. The method as defined in claim 10, further including communicatively coupling the interface to a cockpit interface of the aircraft.

* * * * *